United States Patent
Licata et al.

(10) Patent No.: US 6,224,724 B1
(45) Date of Patent: *May 1, 2001

(54) PHYSICAL VAPOR PROCESSING OF A SURFACE WITH NON-UNIFORMITY COMPENSATION

(75) Inventors: Thomas J. Licata, Monroe, NY (US); Steven D. Hurwitt, deceased, late of Park Ridge, NJ (US), by Anne M. Hurwitt, executrix

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/119,291

(22) Filed: Jul. 20, 1998

Related U.S. Application Data

(63) Continuation-in-part of application No. 08/734,207, filed on Oct. 21, 1996, now Pat. No. 5,783,048, which is a continuation of application No. 08/393,614, filed on Feb. 23, 1995, now abandoned, which is a continuation of application No. 08/971,512, filed on Nov. 17, 1997, now Pat. No. 6,132,564.

(51) Int. Cl.[7] .................................................. C23C 14/34

(52) U.S. Cl. ............................. 204/298.06; 204/298.07; 204/298.16; 204/298.19; 204/298.2

(58) Field of Search ........................ 204/298.06, 298.07, 204/298.08, 298.16, 298.17, 298.19, 298.2; 156/345; 118/723 MR, 723 MA, 723 E, 723 I, 723 IR

(56) References Cited

U.S. PATENT DOCUMENTS

| | | | |
|---|---|---|---|
| Re. 34,106 | 10/1992 | Ohmi | 204/298.08 |
| 3,594,295 | 7/1971 | Meckel et al. | 204/192.12 |
| 3,956,093 | 5/1976 | McLeod | 204/192.12 |
| 4,464,223 | 8/1984 | Gorin | 438/729 |
| 4,657,619 | 4/1987 | O'Donnell | 156/345 |
| 4,824,546 | 4/1989 | Ohmi | 204/298.08 |
| 4,844,775 | 7/1989 | Keeble | 216/68 |
| 4,863,549 | 9/1989 | Grunwald | 156/345 |
| 4,871,433 | 10/1989 | Wagner et al. | 204/192.12 |
| 4,891,560 | 1/1990 | Okumura et al. | 315/111.41 |
| 4,971,674 | 11/1990 | Hata | 204/192.12 |
| 4,999,096 | 3/1991 | Nihei et al. | 204/192.3 |
| 5,047,130 | 9/1991 | Akao et al. | 204/192.12 |
| 5,130,005 | 7/1992 | Hurwitt et al. | 204/192.12 |

(List continued on next page.)

FOREIGN PATENT DOCUMENTS

| | | |
|---|---|---|
| 0762471A1 | 7/1996 | (EP) . |
| 0837490A2 | 4/1998 | (EP) . |
| 61-190070 | 8/1986 | (JP) . |
| 61-246368 | 11/1986 | (JP) . |
| 62-167877 | 7/1987 | (JP) . |
| 8246147 | 9/1996 | (JP) . |

*Primary Examiner*—Rodney McDonald
(74) *Attorney, Agent, or Firm*—Wood, Herron & Evans, LLP

(57) ABSTRACT

An apparatus and method for compensating the process-related asymmetries produced in physical vapor processing of a surface. The apparatus and method may be used on either a substrate when sputtering material from a source or when using an ionized physical vapor deposition (IPVD) apparatus to either deposit a film onto or remove material from a substrate. A compensating magnet is configured and positioned to produce a compensating magnetic field. The compensating magnetic is positioned to offset the effects of chamber and process-related asymmetries, particularly those that affect the distribution of plasma processing on a substrate where the plasma has been otherwise symmetrically produced. Assymetries about an axis of the substrate, for example, are corrected, in, for example, systems such as sputter coating machines where a rotating magnet cathode or other such technique produces an initially symmetrical plasma. Asymmetrical non-uniformities in deposited films are reduced to an acceptable amount and substrates may be cleaned in situ prior to metallization.

35 Claims, 9 Drawing Sheets

U.S. PATENT DOCUMENTS

| | | | |
|---|---|---|---|
| 5,147,520 | 9/1992 | Bobbio | 204/192.33 |
| 5,160,595 | 11/1992 | Hauzer et al. | 204/192.38 |
| 5,171,415 | 12/1992 | Miller et al. | 204/298.09 |
| 5,178,739 | 1/1993 | Barnes et al. | 204/192.12 |
| 5,182,001 | 1/1993 | Fritsche et al. | 204/192.12 |
| 5,196,105 | 3/1993 | Feuerstein et al. | 204/298.19 |
| 5,277,778 | 1/1994 | Daube et al. | 204/298.19 |
| 5,308,417 * | 5/1994 | Groechel et al. | 118/723 MA |
| 5,401,350 | 3/1995 | Patrick et al. | 156/345 |
| 5,417,833 | 5/1995 | Harra et al. | 204/298.2 |
| 5,431,799 | 7/1995 | Mosely et al. | 204/298.06 |
| 5,449,432 | 9/1995 | Hanawa | 438/710 |
| 5,468,296 | 11/1995 | Patrick et al. | 118/723 MP |
| 5,540,800 | 7/1996 | Qian | 156/345 |
| 5,540,824 | 7/1996 | Yin et al. | 204/298.34 |
| 5,560,776 | 10/1996 | Sugai et al. | 118/723 AN |
| 5,569,363 | 10/1996 | Bayer et al. | 204/192.32 |
| 5,763,851 * | 6/1998 | Forster et al. | 219/121.43 |
| 5,783,048 | 7/1998 | Hurwitt | 204/192.12 |

\* cited by examiner

PHYSICAL VAPOR PROCESSING OF A SURFACE WITH NON-UNIFORMITY COMPENSATION

This is a Continuation-In-Part of U.S. patent application Ser. No. 08/734,207 filed Oct. 21, 1996, U.S. Pat. No 5,783,048 which is a file wrapper continuation of U.S. patent application Ser. No. 08/393,614 filed Feb. 23, 1995 (abandoned); and of U.S. patent application Ser. No. 08/971,512 filed Nov. 17, 1997, now U.S. Pat. No. 6,132,564 all of which are hereby expressly incorporated by reference herein.

FIELD OF THE INVENTION

This invention relates to the control of physical vapor etching and depositing processes, and particularly of sputter etching or depositing of a material in the manufacture of semiconductor substrates by a sputtering cathode

BACKGROUND OF THE INVENTION

The manufacture of semiconductor devices and integrated circuits involves the blanket and selective deposition and blanket and selective removal of many layers of conductive, insulating and semi-conductive material on substrates that are usually in the form of silicon wafers. Important processes for such deposition and removal of material include physical vapor depositing and etching processes. Sputtering is one commonly used mechanism for providing material for coating and removing material in such physical vapor processes. In a conventional sputter deposition system, a target is sputtered and the sputtered material forms a thin coating or film on a substrate. In a conventional sputter etch system, material is removed from a surface such as a target or a substrate.

Semiconductor manufacture processes typically include forming a series of metal interconnect film stacks on a wafer, then applying a photo-resist pattern followed by reactive etching processes rendered selective by the pattern. Once patterned and selectively etched, a subsequent stack of conductive layers is applied to the wafer. The lowermost of these conductive layers is usually a reactive elemental metal such as titanium, chromium or tantalum, but may also be a metal nitride, silicide or alloy. One function of this lowermost metallization layer is to form a bond or contact with an exposed conductive layer, such as silicon or metal, at the bottom of a contact hole in the underlying insulator. The bond serves to form the initial film portion of a conductive path between the underlying layer and the conductor of a new layer of the new stack.

It is usually necessary to clean the wafer of native oxides and other contaminants that may form before applying the metallization layer or to otherwise condition the surface of the wafer before coating. Contamination interferes with application of the metallization layer and results in degraded conductivity between the contact and the metallization layer. However, standard approaches to removing contaminants, such as subjecting the wafer to a thorough cleaning with an inductively coupled plasma (ICP) or other soft sputter etch step immediately before initiating metallization, are not entirely satisfactory. This is due at least in part to the damage of the underlying device structure, either by the mechanical sputtering action or by the accumulation of charge, or to the incomplete removal of contaminants when chemical removal methods cannot be used or are otherwise absent.

In a conventional sputter deposition arrangement, a target and substrate are located within one or more processing chambers where the sputtering process is performed. The target includes a back surface and a concave shaped front, or sputtering, surface. The sputtering surface provides target material for forming a thin film on the substrate during the sputtering process. The back surface is secured to a sputtering cathode which serves to cool the target during the sputtering process. The substrate is removably secured to a support fixture adjacent an outer edge of the substrate and is positioned a predetermined distance from the sputtering surface, thus forming a gap between the substrate and the sputtering surface.

For sputter deposition of a material, a process gas such as argon is introduced into the processing chamber and maintained at a vacuum level suitable for sputtering. A high DC or AC voltage is then applied to the cathode and target to form a plasma discharge having positively charged argon ions which bombard the negatively charged sputtering surface. This causes target material to be removed from the sputtering surface and initiates a deposition process wherein some of the target material is deposited onto the substrate to form a film. Typically, the deposition process may require between 5 seconds and 5 minutes to complete. The substrate may be held in a stationary position relative to the sputtering surface during the deposition process or may be slowly scanned in a direction parallel to the sputtering surface.

The cathode may include a main magnet for concentrating the plasma and controlling the shape and relative intensity of the plasma over various locations on the sputtering surface. In addition, the main magnet may be adapted to rotate about a rotation axis or otherwise move relative to the target. A main magnet may also be positioned adjacent to a substrate to control sputter etching of the substrate. The main magnet is typically configured to create a continuous closed magnetic tunnel having a predetermined shape which may include a plurality of lobe portions, each having an outer peripheral lobe section located adjacent to the peripheral wall of the target. Rotation of the main magnet about the axis causes a corresponding rotation of the magnetic tunnel relative to the sputtering surface. This controls the plasma discharge so as to cause removal of target material in a symmetric pattern from the sputtering surface.

With a sputtering target, rotation controls the plasma so as to form concentric grooves such as primary, secondary and tertiary concentric grooves, each having respective diameters symmetrically formed about a center area of the sputtering surface. The primary groove has the largest diameter and is positioned adjacent to the peripheral wall. The tertiary groove has the smallest diameter and is positioned around the center area, and the secondary groove has an intermediate diameter and is thus positioned between the primary and tertiary grooves. Typically, the primary groove is formed deeper, and has a greater circumference, than either the secondary or tertiary grooves. This indicates that a greater amount of target material is eroded to form the primary groove. Therefore, formation of the primary groove provides a substantial portion of the material used to form a film, which thus has a substantial effect on overall film uniformity on the substrate. Further, the erosion of a substantial amount of material near the peripheral wall also improves the capability of providing a uniform film thickness in areas near the outer edge of the substrate.

It is desirable that a film formed on the substrate have a highly uniform thickness, to $\leq$ about ±5% and preferably to $\leq$ about ±1% for the thickest and thinnest areas of the film. Several factors affect the ability to produce a film having a highly uniform thickness. These factors include the geometrical relationship between the target and substrate, the design of the cathode and the erosion pattern of material removed from the sputtering surface resulting from the shape of the magnetic tunnel.

The main magnet generates a main magnetic field and serves to control the shape and intensity of the plasma discharge in order to ultimately form the primary groove. The primary groove includes a pair of walls, each of which extends gradually deeper into the target to meet at, and, thus define the deepest portion of the primary groove at a groove center. Further, the groove center is caused to be positioned a first distance from the peripheral wall and within a predetermined area of the sputtering surface.

Preferably, in sputter coating, rotation of the main magnet causes the formation of a symmetrical film on a substrate. The deposition profile would then represent overall thickness uniformity along any radius extending in any direction on a substrate. Further, any undesirable non-uniformities existing in a symmetrical film would also be symmetrical. Such symmetrical non-uniformities can be reduced by techniques such as changing the distance between the sputtering surface and the substrate or by modifying the erosion profile through adjustment of the shape of the magnetic tunnel.

However, factors exist which frequently cause the formation of asymmetrical non-uniformities. These factors include asymmetrical system related conditions such as the presence of nearby structures which may distort the shape of the plasma discharge, other cathodes located in nearby processing chambers, or the existence of flow and pressure gradients. These factors can distort the motion of ions and particles moving toward the surface being sputtered. In coating, this can mean that material that is sputtered or otherwise emitted from a source in a symmetrical pattern about an axis of the substrate will arrive at the surface of the substrate in a non-symmetrical distribution. In sputter etching, this can mean that the ions or other particles bombarding a surface of a substrate, even if emitted in a symmetrical pattern around an axis of the substrate, strike the substrate in a non-uniform distribution or at non-uniform angles around the axis. These factors can also affect the distribution of ions bombarding a sputtering target. As a result, if these factors are not taken into account and dealt with, they can cause non-uniformities in the coatings being applied to a substrate or in the removal of material from, or the conditioning of, a substrate or other surface from which material is being removed. Techniques for correcting symmetrical non-uniformities, such as changing the distance between the sputtering surface and the substrate or adjusting the shape of the magnetic tunnel, however, are not effective in reducing asymmetrical non-uniformities to an acceptable amount.

Thus, there is a need for an effective and inexpensive process that prevents contaminants from interfering with the metallization of surfaces at which contacts on the lowermost layer of a stack or other interconnects are to be formed. There is also a need to control physical processes to overcome the effects of factors that affect the uniformity of sputter deposition of material to reduce non-uniformities in a thickness of a deposited film.

SUMMARY OF THE INVENTION

The invention is directed to an apparatus for sputtering material from a source onto a substrate in a process chamber that asymmetrically causes a change in the distribution of material from the source to an asymmetrically non-uniform distribution on the substrate. The invention is also directed to an apparatus for processing a substrate in a process chamber that causes an asymmetrically non-uniform distribution of processing ions about an axis of the substrate. The invention is more particularly directed to an ionized physical vapor deposition (IPVD) apparatus for processing a substrate in a process chamber that has characteristics which asymmetrically cause an asymmetrically non-uniform distribution from a source onto the substrate.

According to one embodiment of the present invention, an apparatus is provided that includes a sputtering chamber containing a processing gas that is energized to form a plasma, a substrate support, a target, a cathode assembly including a main magnet and a compensating magnet that is positioned to produce a compensating magnetic field, in a plasma discharge gas used to remove material from the target, that is effective to change the shape of the distribution of the plasma so as to remove material from the target in a distribution which compensates for the otherwise asymmetrically non-uniform distribution. The compensating magnet may include components fixed relative to the components of the chamber which asymmetrically cause the asymmetrical non-uniform distribution onto the substrate.

In one preferred embodiment of the invention, an apparatus is provided that includes a vacuum processing chamber having therein a substrate support, a source of vaporized material that is moveable in an asymmetrical non-uniform distribution onto a substrate and a gas, a radio frequency (RF) energy source and a coil connected to the RF energy source and surrounding the chamber so as to produce a plasma in the gas between the source and the substrate support to ionize material moving from the source onto the substrate, and an electromagnetic energy source coupled to the substrate. The apparatus further includes a compensating magnet positioned to produce a compensating magnetic field in the path of the ionized material that is effective to change the shape of the distribution material to produce a compensated distribution to thereby compensate for the asymmetrically non-uniform distribution.

In alternative embodiments, an apparatus is provided which includes a vacuum processing chamber having therein a support for a surface to be bombarded with ions from a plasma and a gas for providing a plasma. The apparatus further includes a main magnet positioned to distribute the plasma to symmetrically produce a distribution of ions about a central axis and a compensating magnet positioned to produce a compensating magnetic field to distribute ions to offset asymmetrical effects of the chamber on the distribution of ions onto the substrate to compensate for the asymmetrically non-uniform distribution.

In various embodiments of the invention, the compensating magnet may include components fixed relative to the components of the chamber which asymmetrically cause the asymmetrical non-uniform distribution onto the substrate.

The present invention reduces substrate asymmetrical plasma processing non-uniformities, particularly non-uniformities about an axis of a substrate and particularly non-uniformities caused by characteristics of a processing chamber. The invention is particularly advantages in offsetting non-uniformities on a substrate caused by stationary elements of a plasma processing chamber that includes an otherwise symmetrical plasma producing device. The invention also provides control of in sputter deposition systems, IPVD systems and in situ pre-metallization cleaning of substrates such as semiconductor wafers.

DETAILED DESCRIPTION

Figure 1:
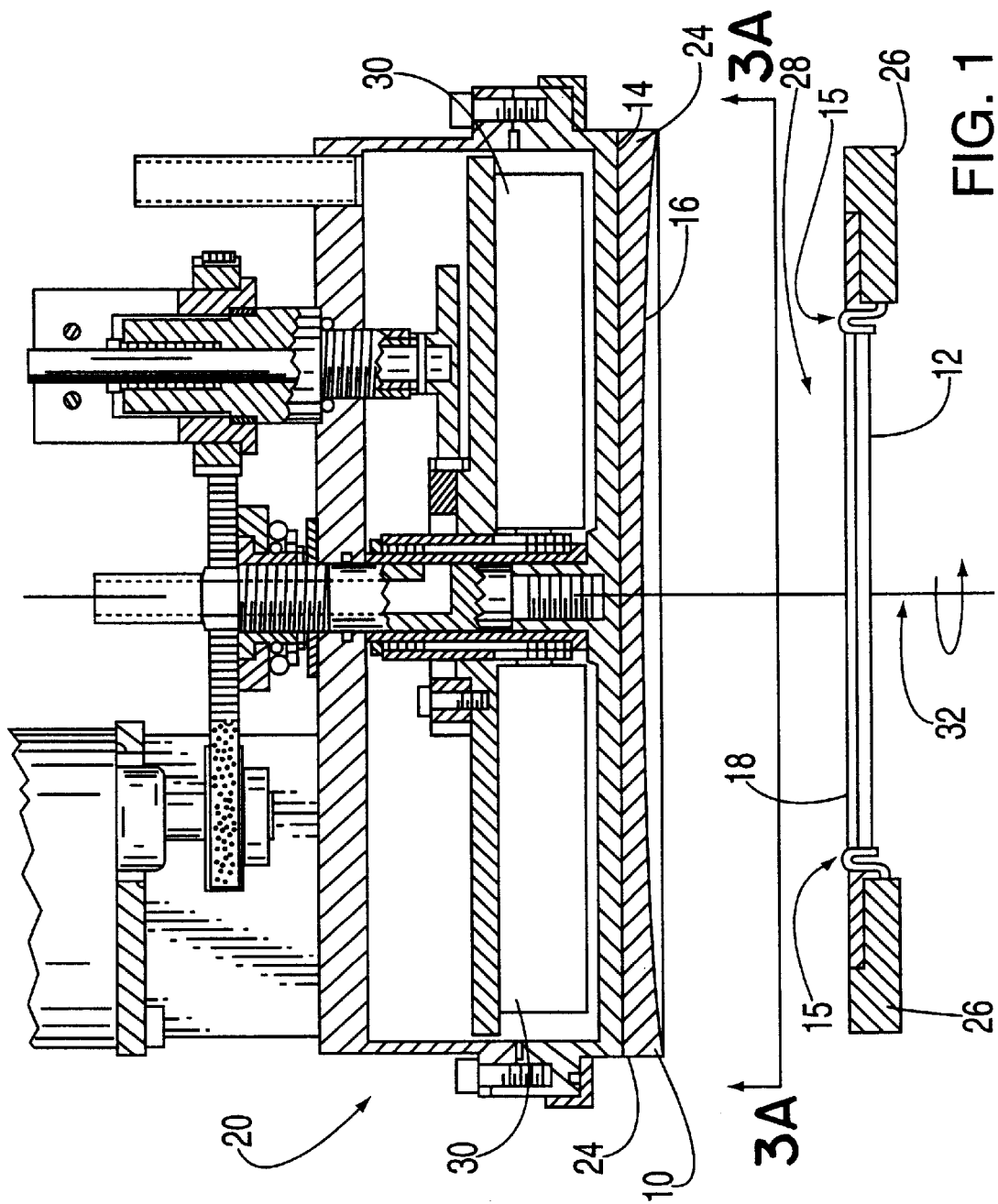
FIG. 1 is a cross-sectional view of a conventional target and substrate arrangement.
Figure 2:
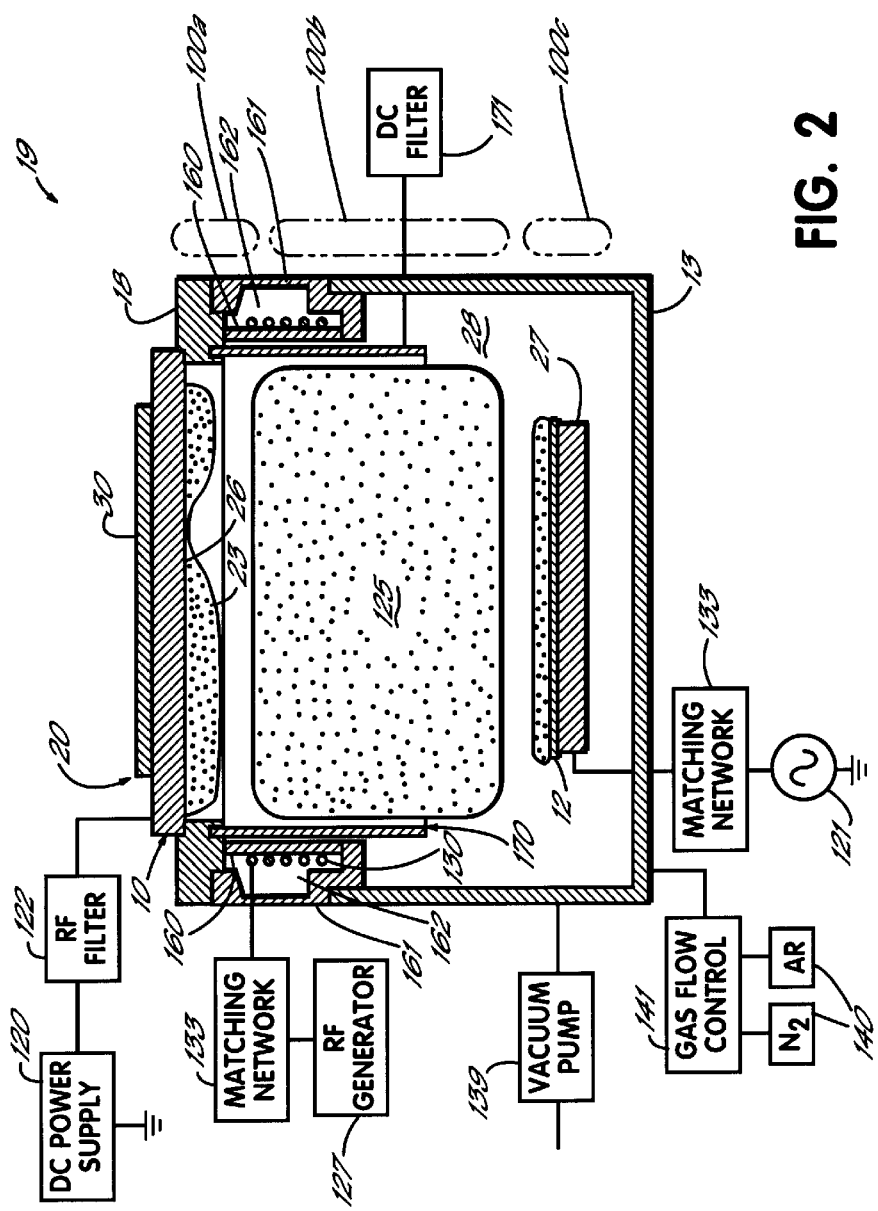
FIG. 2 is an elevational diagrammatic representation of an IPVD sputtering apparatus.

Referring to FIG. 1, a cross-sectional view of a conventional arrangement for a target 10 and wafer or substrate 12 is shown. The target 10 and substrate 12 are located within a processing chamber 13 which may be an Ionized Physical Vapor Deposition (IPVD) apparatus 19 as shown in FIG. 2 wherein the sputtering process is performed. The IPVD apparatus 19 may be part of a sputter deposition system that includes a plurality of processing chambers 13, more than one of which may include a target 10 and substrate 12 arrangement as shown in FIG. 1. The target 10 includes a top or back surface 14 and a concave shaped bottom front or sputtering surface 16. The sputtering surface 16 provides target material for forming a thin film 18 on the substrate 12 during the sputtering process. The back surface 14 is secured to a sputtering cathode assembly 20 which serves to cool the target 10 during the sputtering process. The substrate 12 is removably secured to a support fixture 26 adjacent an outer edge 15 of the substrate 12 and is mounted in the chamber 13 at one end by a support or susceptor 27 for supporting a semiconductor wafer 12 mounted thereon. The substrate 12 is typically positioned a predetermined distance from the sputtering surface 16, thus forming a processing space or gap 28 between the substrate 12 and the sputtering surface 16.

FIG. 2 diagrammatically illustrates an Ionized Physical Vapor Deposition (IPVD) apparatus 19 such as that illustrated and described, for example, in U.S. patent application Ser. No. 08/844,756, filed on Apr. 21, 1997, which is expressly incorporated by reference herein. The apparatus includes a vacuum tight processing space 28 enclosed in the chamber 13. The wafer 12, when mounted on the support 26, is parallel to and faces the target 10. The target 10 is formed of a sputter coating material, for example, titanium metal. The processing space 28 is a generally cylindrical space that is maintained at an ultra high vacuum pressure level and is filled with a processing gas, such as argon, during processing, and may include some other gas such as nitrogen.

The target 10 is part of a cathode assembly 20 mounted in the chamber 13 at an end thereof opposite the substrate holder 27. The cathode assembly 20 includes a support fixture 26 to which the target 10 is secured. A main magnet 30 is typically provided behind the support fixture 26 on the opposite side thereof from the-support 27. A dark space shield (not shown) may also be provided around the periphery of the target 10. The main magnet 30 preferably includes magnets that produce a closed magnetic tunnel over the target 10 that traps electrons given off into the chamber 13 by the cathode assembly 20 when it is electrically energized to a negative potential, as is familiar to one skilled in the art. The magnets 30 may be permanent or electromagnets of any one of a number of magnetron sputtering assemblies known in the art, but is preferably that described and illustrated in U.S. Pat. No. 5,130,005, expressly incorporated by reference herein. The magnetic tunnel produced by the magnet 30 traps and shapes a plasma 23 which sweeps over the surface of the target 10 as the magnet 30 rotates.

Figure 3A:
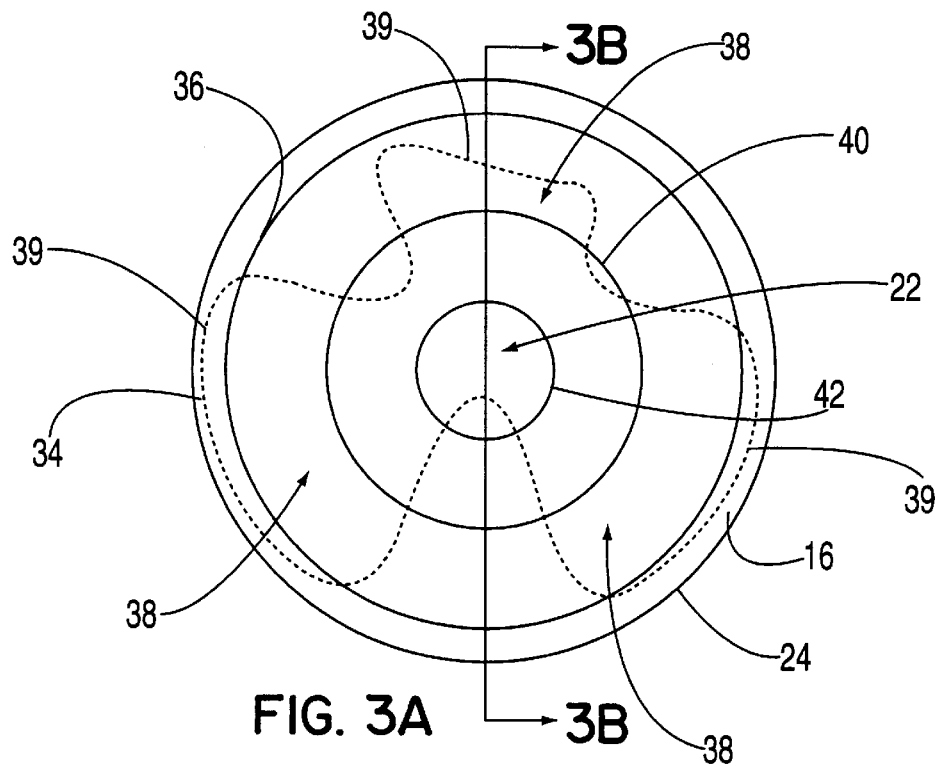
FIG. 3A is a view of a sputtering surface along line 3A—3A of FIG. 1.

The magnetic tunnel affects the shape and relative intensity of the plasma 23 over various locations on the sputtering surface 16. In addition, the main magnet 30 may be fixed or may be adapted to rotate or otherwise move relative to the target 10 about a rotation axis 32. Referring to FIG. 3A in conjunction with FIG. 1, a view of the sputtering surface 16 along line 3A—3A of FIG. 1 is shown. The sputtering surface 16 has a substantially circular shape which is defined by a peripheral wall 24. The main magnet 30 is typically configured to create a continuous closed magnetic tunnel 34 (shown as dashed lines) having a predetermined shape. By way of example, the magnetic tunnel 34 may include a plurality of lobe portions 38 each having an outer peripheral lobe section 39 located adjacent to the peripheral wall 24 of the target 10. Rotation of the main magnet 30 about the axis 32 causes a corresponding rotation of the magnetic tunnel 34 relative to the sputtering surface 16. This controls the plasma 23 so as to cause removal of target material in a symmetric pattern from the sputtering surface 16 to form concentric grooves in a well known matter.

By way of example, primary 36, secondary 40 and tertiary 42 concentric grooves each having respective diameters may be symmetrically formed about a center area 22 of the sputtering surface 16. The primary groove 36 has the largest diameter and is positioned adjacent to the peripheral wall 24. The tertiary groove 42 has the smallest diameter and is positioned around the center area 22. The secondary groove 40 has a diameter whose size is between that of the primary 36 and tertiary 42 grooves, thus positioning the secondary groove 40 between the primary 36 and tertiary 42 grooves.

Figure 3B:
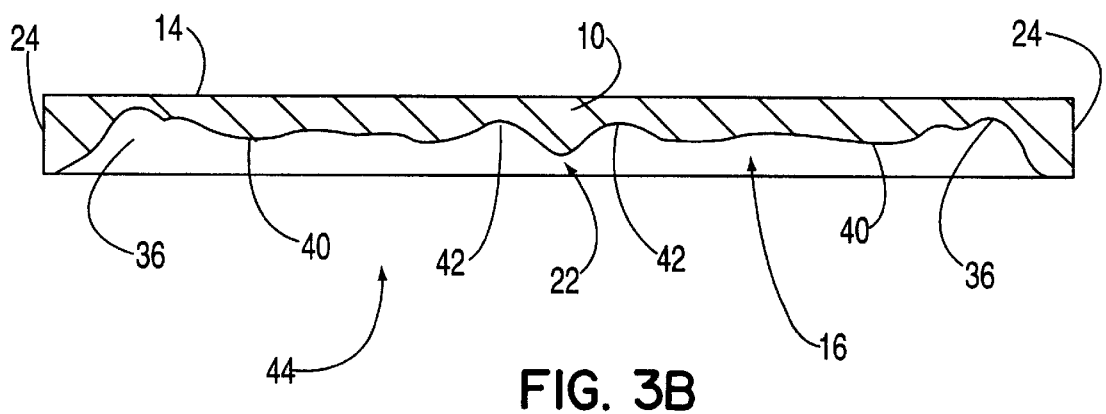
FIG. 3B is a cross-sectional view of an erosion profile for the target along line 3B—3B of FIG. 3A.

Referring to FIG. 3B, a cross-sectional side view of an erosion profile 44 of the target 10 along section line 3B—3B of FIG. 3A is shown. As the magnetic tunnel 34 rotates, the plasma 23 causes the formation of a symmetric erosion pattern wherein separate portions of the sputtering surface 16 erode in a circular pattern to form the primary 36, secondary 40 and tertiary 42 grooves. Typically, the primary groove 36 is formed deeper, and has a greater circumference, than either the secondary 40 or tertiary 42 grooves. This indicates that a greater amount of target material is eroded to form the primary groove 36 than is eroded to form either the secondary 40 or tertiary 42 grooves. Therefore, formation of the primary groove 36 provides a substantial portion of the material used to form the film 18, which thus has a substantial effect on overall film uniformity on the substrate 12. Further, the erosion of a substantial amount of material near the peripheral wall 24 also improves the capability of providing a uniform film thickness in areas near the outer edge 15 of the substrate 12.

Figure 3C:
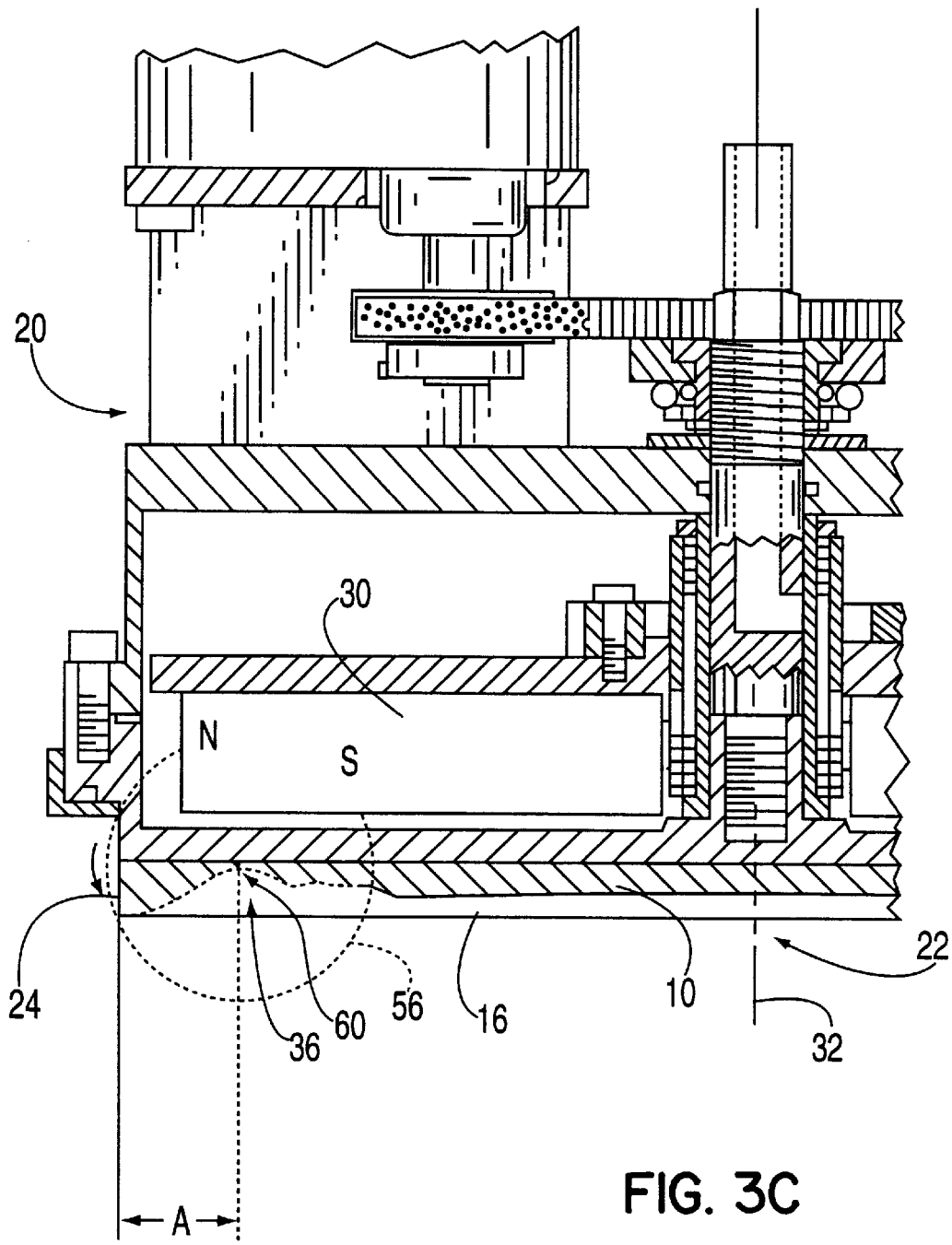
FIG. 3C is an enlarged view of a left portion of FIG. 1 showing a configuration for a primary groove.

Referring to FIG. 3C, a left portion of the target 10 and cathode assembly 20 described in conjunction with FIG. 1 is shown in an enlarged view. In FIG. 3C, a configuration is depicted for the primary groove 36 (shown as dashed lines). The main magnet 30 generates a main magnetic field 56 (shown as dashed lines) oriented in a counterclockwise direction. The magnetic field 56 serves to control the shape and intensity of the plasma 23 in order to ultimately form the primary groove 36. The primary groove 36 includes a pair of walls each of which extend gradually deeper into the target 10 and meet to thus define the deepest portion of the primary groove 36 at a groove center 60. Further, the groove center 60 is positioned a first distance A from the peripheral wall 24 and within a predetermined area of the sputtering surface 16.

Figure 3D:
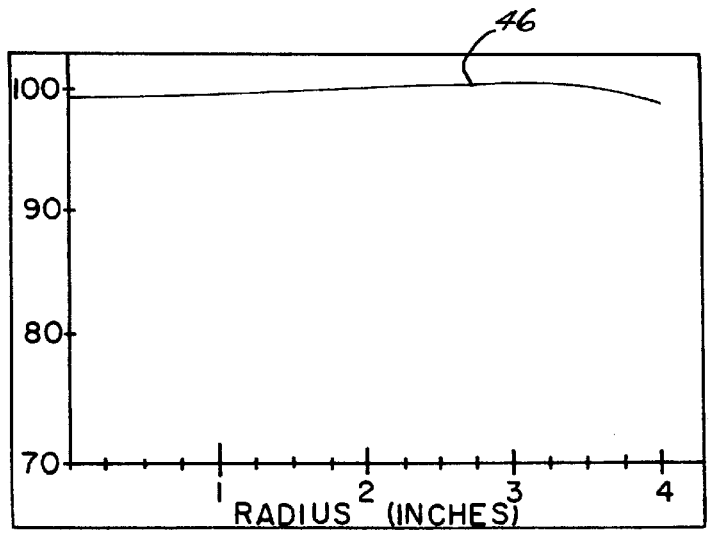
FIG. 3D depicts an erosion profile for a film.

Referring to FIG. 3D, a plot of a deposition profile 46 for a simulated film layer is shown. The deposition profile 46 illustrates thickness uniformity for the layer along a radius extending in any selected direction on a substrate. The layer was formed through use of a computer modeling technique which simulated a sputtering process for forming the layer in accordance with selected input parameters. One input parameter included eroding a sputtering surface so as to form the erosion profile 44 previously described in conjunction with FIG. 3B. Another input parameter included positioning the sputtering surface two inches from a substrate having a four inch radius. These parameters result in a simulated, or theoretical, thickness uniformity of 0.942% for the simulated layer.

Figure 4:
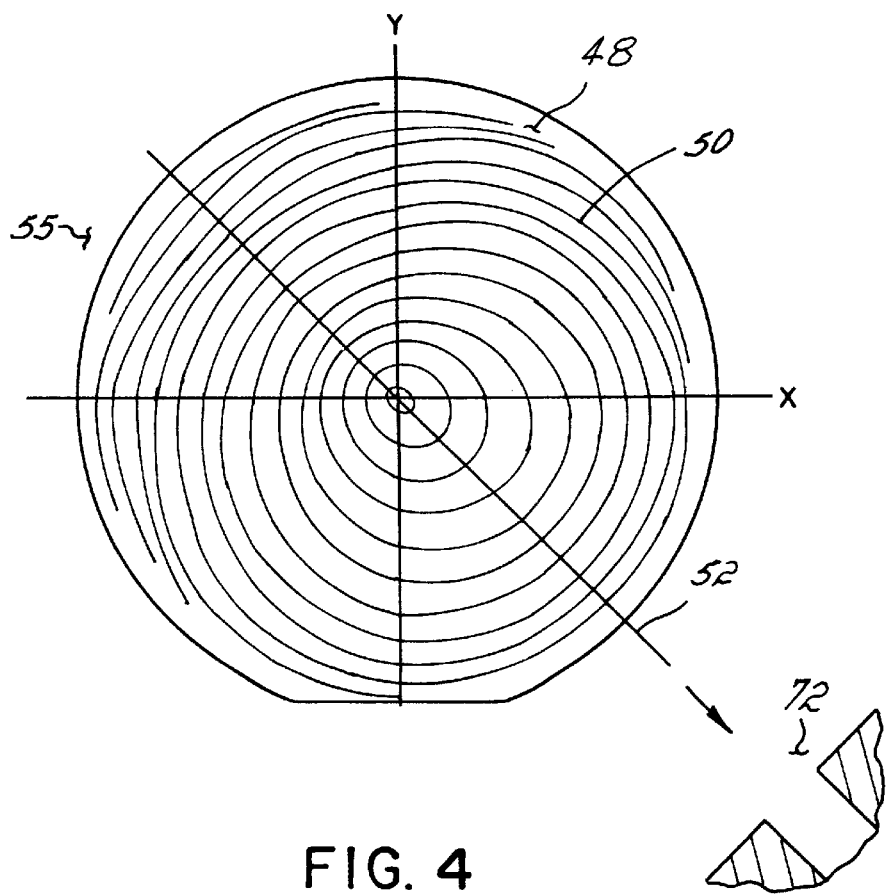
FIG. 4 is a map of the uniformity for an aluminum film formed on a wafer formed by a sputtering process subjected to flow and pressure gradients.

Asymmetrical non-uniformities may result if distribution of the process gas relative to the target 10 and substrate 12 is affected by the existence of flow and pressure gradients. FIG. 4 depicts a map 55, plotted relative to x-y axes, of the uniformity of an aluminum film (not shown) formed on a 200 mm diameter silicon wafer (not shown). The aluminum film was formed by using the conventional arrangement for the target 10 and substrate 12 described previously in conjunction with FIGS. 1–3C. In FIG. 4, a plurality of first contour lines 48 are shown, each of which are obtained by connecting points measured on the wafer which have the same film thickness. The first contour lines 48 include a mean contour line 50 (shown darker than other contour lines) indicating a mean film thickness. Additionally, first contour lines designated by either a "+" sign or a "−" sign indicate film thickness which are either less than or greater than the mean film thickness, respectively. Thickness values for selected contour lines are shown in descending order in TABLE I.

TABLE I

| (microns) |
| --- |
| 1.22124 |
| 1.20930 |
| 1.19753 |
| 1.18567 (MEAN) |
| 1.17381 |

TABLE I-continued

| (microns) |
| --- |
| 1.16196 |
| 1.15010 |

Further, film non-uniformity was determined to be 3.84%.

The first contour lines 48 are non-concentric relative to one another and are positioned asymmetrically relative to the x-y axes, thus indicating that the aluminum film is asymmetrically formed on the wafer. It has been determined that this is due to an effect known as "pumping skew." Typically, conventional sputter deposition systems include a pump (not shown) which is used to evacuate the system. Further, such systems include a pumping port 72 through which evacuation is performed. For the purposes of illustration, the pumping port 72 is shown located in a lower right section of FIG. 4 relative to the map 55. This corresponds to the location of the pumping port 72 relative to the target and wafer in the system. It has been found that evacuation of the system also undesirably alters a desired flow pattern for the process gas. In particular, evacuation by the pump causes the process gas to flow in a direction (indicated by first arrow 52) toward the pumping port 72. This results in a skewing of process gas distribution toward the pumping port 72, ultimately resulting in the formation of a film having undesirable asymmetric non-uniformities.

The skewing of process gas and other factors can affect the uniformity of processing on the substrate 12 in an IPVD apparatus 19 in three ways. One way that such factors affect substrate surface uniformity is by perturbing the motion and incidence of coating material incident upon the surface of the substrate 12 that is being used to coat the surface of the substrate 12. A second way that such factors can affect the substrate surface uniformity is by perturbing the distribution and incidence of ions or other particles that are used in etching or conditioning the surface of the substrate 12. A third way that such factors can affect the substrate surface uniformity is by perturbing the distribution and incidence of sputtering ions that are used in removing material from the surface of the target 10 that are used for coating or etching the substrate 12.

A substantial portion of the material used in forming the film 18 is obtained from the erosion of target material from the sputtering surface 16 which forms the primary groove 36. Therefore, changes in a radial direction in the location in sections of the primary groove 36, which affect the amount of target material eroded to form the primary groove 36, have a substantial effect on the pattern and uniformity of the film 18 that is formed on the substrate 12.

Figure 5:
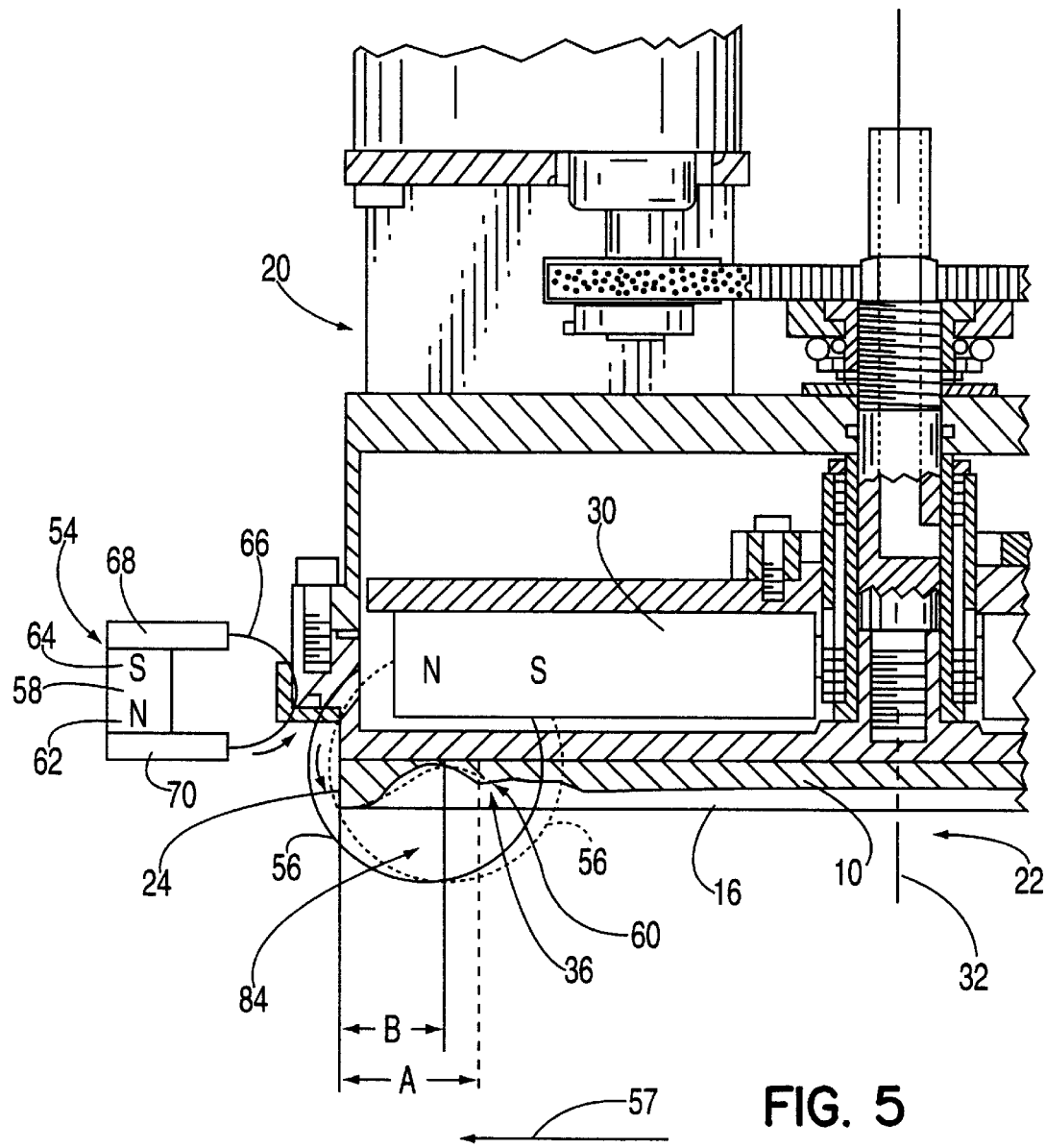
FIG. 5 is an enlarged view of a left portion of FIG. 1 showing a first compensating magnet.

Referring to FIG. 5, in accordance with one embodiment of the present invention a first compensating magnet or magnet device 54 is shown positioned adjacent to the target 10. In the following description of FIGS. 5–7, the primary groove 36 and the main magnetic field 56 are shown in solid lines to indicate a change in location wherein the primary groove 36 is ultimately formed due to the present invention.

The first compensating magnet 54 is spaced apart from the peripheral wall 24 and is positioned adjacent to a first area 84 on the sputtering surface 16 of target 10 which includes the primary groove 36. The first compensating magnet 54 includes a permanent magnet 58 having north 62 and south 64 magnetic poles. In a first embodiment, the permanent magnet 58 is oriented such that the south magnetic pole 64 is vertically positioned above the north magnetic pole 62 to form a first compensating magnetic field 66 oriented in counterclockwise direction. Further, the permanent magnet 58 is positioned between top 68 and bottom 70 field directing pole pieces which serve to control distribution of the first magnetic field 66. Alternatively, the top 68 and bottom 70 field directing pole pieces may be omitted. In addition, an electromagnetic device or soft magnetic shunts may be used.

The first compensating magnetic field 66 interacts with each outer peripheral lobe section 39 of the main magnetic field 56 so as to cause the main magnetic field 56 to shift outward (indicated by second arrow 57) and away from the center area 22 and toward the peripheral wall 24. This causes a corresponding outward shift in the location at which a section of the primary groove 36 is ultimately formed within the first area 84. In particular, a primary groove 36 is formed in the first area 84 such that the groove center 60 is positioned a second distance B from the peripheral wall 24 which is less than the first distance A. The outward shift increases the length of the primary groove 36, which thus increases the amount of target material eroded. Further, the outward shift also changes the radial location on the sputtering surface 16 from which the target material is eroded to one that is closer to the peripheral wall 24.

As previously described, a substantial portion of the material used in forming the film 18 is obtained from the erosion of target material from the sputtering surface 16 which forms the primary groove 36. Therefore, an outward shift in the location of the primary groove 36, which causes the erosion of additional target material, substantially affects the pattern and uniformity of the film 18 that is ultimately formed on the substrate 12.

Figure 6:
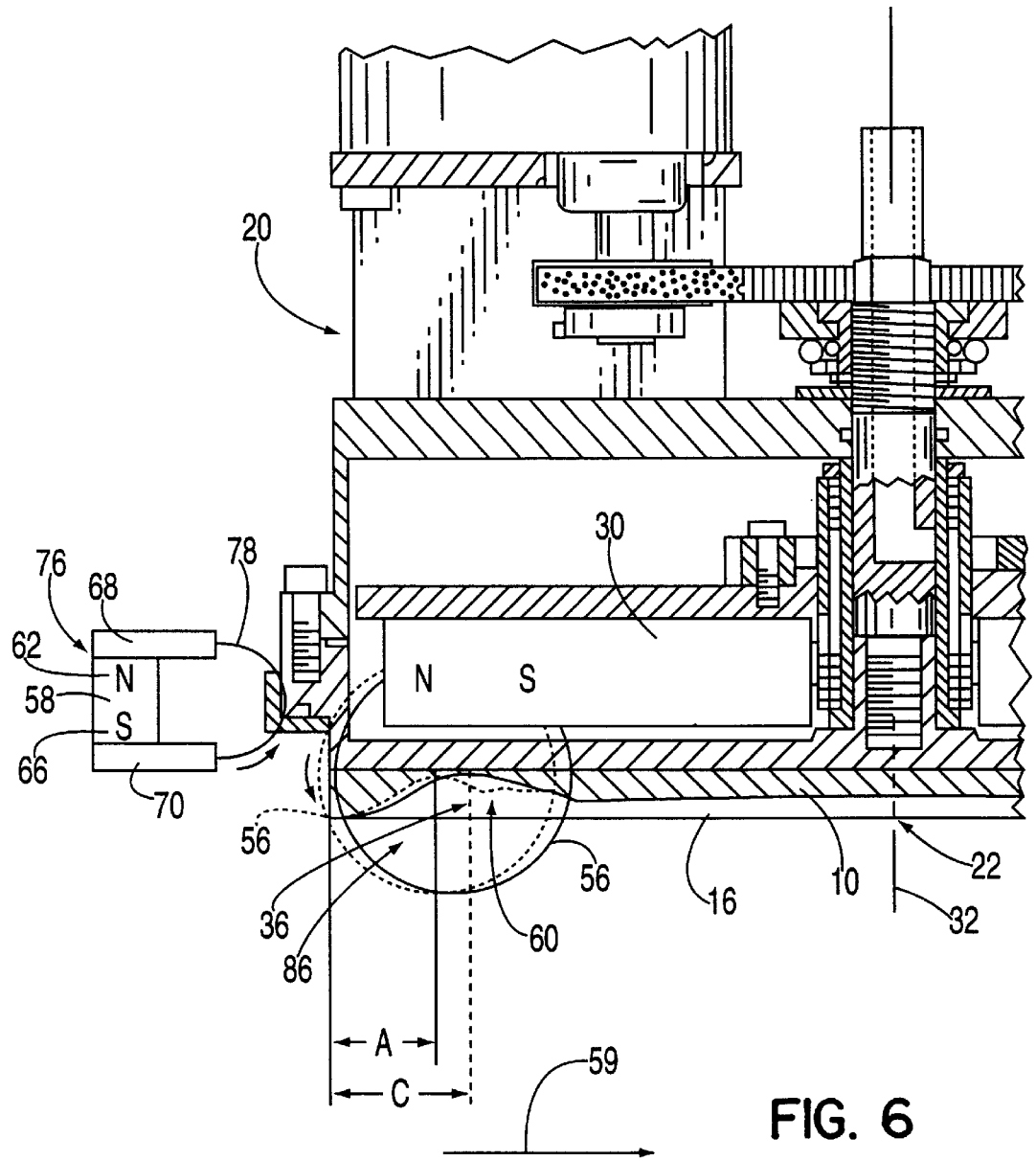
FIG. 6 shows a second embodiment for a second compensating magnet.

Referring to FIG. 6, a second embodiment for a second compensating magnet or magnet device 76 is shown. The second magnet 76 is positioned adjacent to a second area 86 on the sputtering surface 16 of target 10 which includes the groove center 60. In the second embodiment, the orientation of the permanent magnet 58 is reversed such that the north magnetic pole 60 is vertically positioned above the south magnetic pole 66 to form a second compensating magnetic field 78 oriented in clockwise direction. The second magnetic field 78 causes the main magnetic field 56 to move in a direction opposite to that described in conjunction with FIG. 4. In particular, the second magnetic field 78 interacts with each outer peripheral lobe section 39 of the main magnetic field 56 so as to cause the main magnetic field 56 to shift inward (indicated by third arrow 59) toward the center area 22 and away from the peripheral wall 24. This causes a corresponding inward shift in the location at which a section of the primary groove 36 is ultimately formed within the second area 86. In particular, the primary groove 36 is formed in the second area 86 such that the groove center 60 is positioned a third distance C from the peripheral wall 24 which is greater than the first distance A. The inward shift decreases the length of the primary groove 36, which thus decreases the amount of target material eroded to form the primary groove 36. Further, the inward shift also changes the radial location on the sputtering surface 16 from which the target material is eroded to one that is further from the peripheral wall 24. This also substantially affects the pattern and uniformity of the film 18 that is ultimately formed on the substrate 12.

It is noted that either the first 54 or second 76 magnet may be optimally positioned either inside or outside of the processing chamber in order to provide for suitable interaction between the main 56 and first 66 and/or second 78 magnetic fields.

Figure 7:
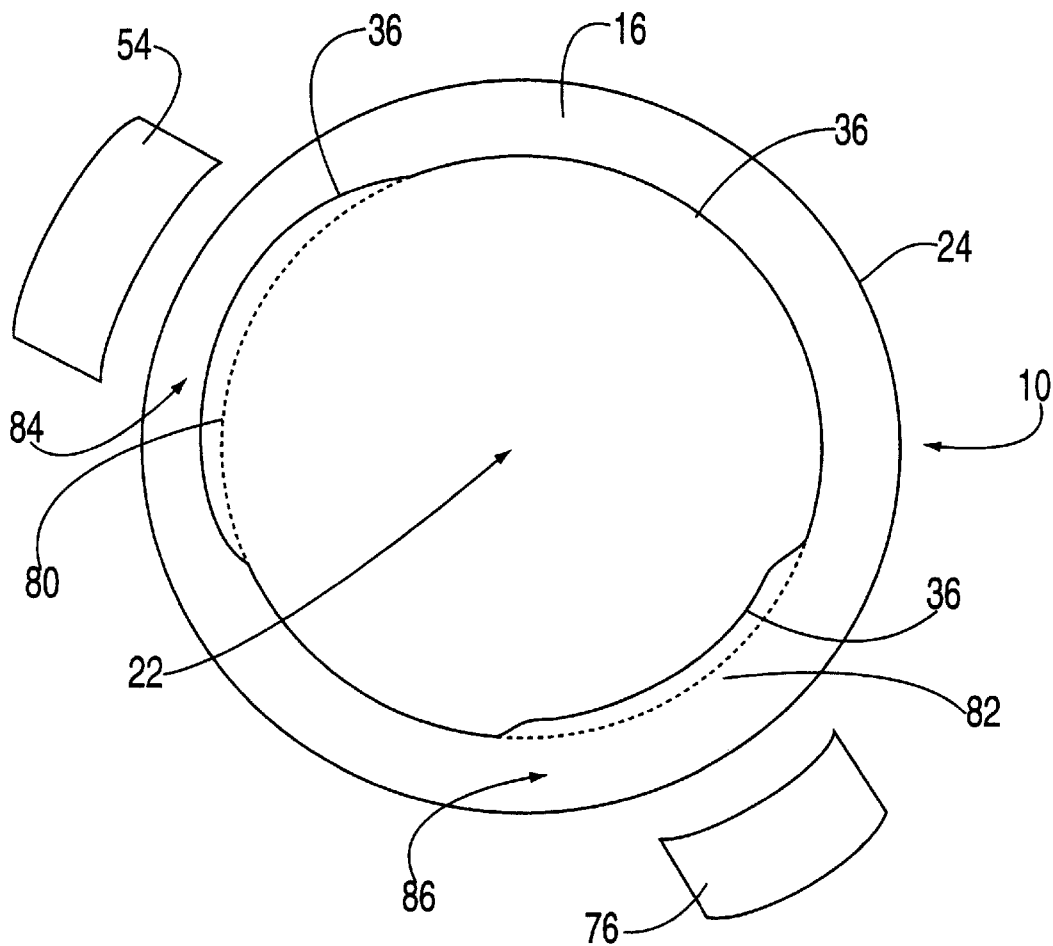
FIG. 7 is a plan view of the first and second compensating magnets shown positioned adjacent to a peripheral wall of the target.

Referring to FIG. 7, a plan view of the sputtering surface 16 is shown wherein the first 54 and second 76 compensating magnets are shown positioned adjacent to the first 84 and second 86 areas, respectively. In this regard, it is noted that additional magnets configured in either the first or second embodiment may be positioned adjacent to other selected areas of the sputtering surface 16 in order to change the location of additional sections of the primary groove 36.

As previously described in conjunction with FIGS. 1–3B, conventional sputter deposition systems typically form a substantially circular primary groove. In accordance with the present invention, the first 54 and second 76 magnets each serve to asymmetrically change the location of first 80 and second 82 sections (shown as dashed lines) of the primary groove 36 located in the first 84 and second 86 areas adjacent to the first 54 and second magnet 76 magnets, respectively. The first magnetic field 66 (FIG. 4) generated by the first magnet 54 causes the main magnetic field 56 to shift outward and away from the center area 22 and toward the peripheral wall 24. This causes a corresponding outward shift in the location at which the first section 80 is formed such that the first section 80 extends outwardly in the first area 84 toward the peripheral wall 24 to thus form an asymmetric erosion pattern.

The second magnetic field 78 (FIG. 6), which is oriented in an opposite direction to that of the first magnetic field 66, causes the second section 82 to extend inwardly toward the center area 22 in a direction opposite to that caused by the first magnetic field 66. In particular, the second magnetic field 78 causes the main magnetic field 56 to shift inward and toward the center area 22 and away from the peripheral wall 24. This causes a corresponding inward shift in the location at which the second section 82 is formed such that the second section 82 extends inwardly in the second area 86 toward the center area 22 to thus form an asymmetric erosion pattern.

Figure 8:
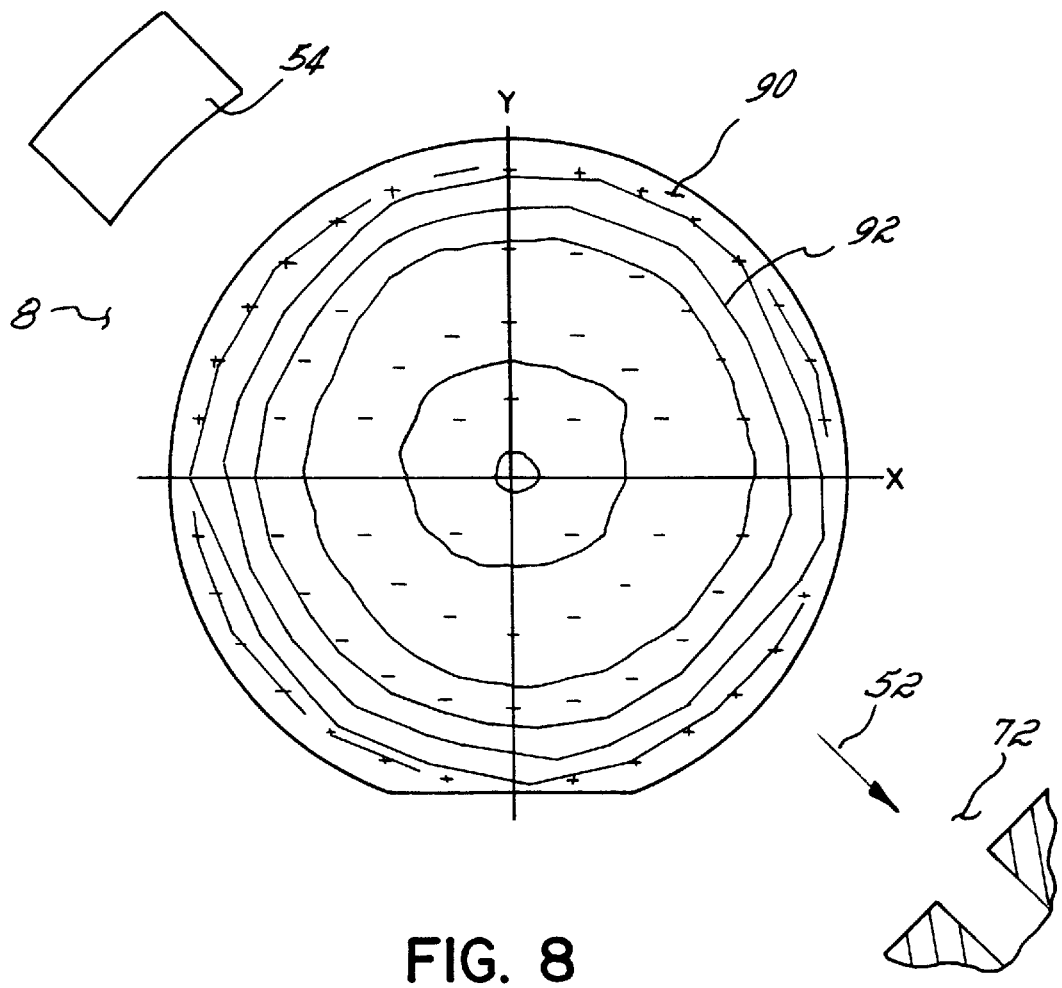
FIG. 8 is a map of the uniformity of an aluminum film formed by using a first magnet in conjunction with a sputtering process subjected to the flow and pressure gradients.

Referring to FIG. 8, a map 88, relative to x-y axes, is shown of the uniformity of an aluminum film (not shown) formed by using the first magnet 54 in conjunction with the flow and pressure gradients previously described in conjunction with FIG. 4. In FIG. 8, the first magnet 54 is shown in a position relative to the map 88 which corresponds to a position adjacent to the peripheral wall 24 and opposite the pumping port 72. The first magnet 54 causes a selected section of the primary groove 36 to shift outward (FIG. 5), thus increasing the amount of material eroded from the sputtering surface 16 which is available for forming the film 18. Further, the outward shift also changes the radial location on the sputtering surface 16 from which the target material is eroded to one that is closer to the peripheral wall 24. This forms a new distribution of target material which counteracts the effects on the process gas distribution due to flow and pressure gradients so as to form a substantially symmetric layer.

In FIG. 8, a second plurality of contour lines 90 are shown which include a second mean contour line 92 (shown darker than other contour lines) indicating a second mean thickness. Thickness values for the second contour lines 92 are shown in descending order in TABLE II.

TABLE II

| (microns) |
| --- |
| 1.16561 |
| 1.15430 |
| 1.14290 |
| 1.13166 (MEAN) |
| 1.12035 |

TABLE II-continued (microns)

1.10903
1.09771

The second contour lines 92 are substantially concentrically positioned relative one another. In addition, the second contour lines 92 are positioned substantially symmetrically relative to the x-y axes and are not skewed. As such, this indicates that the aluminum film is substantially symmetrically formed on the substrate. Further, non-uniformity is substantially improved to 1.99%.

As best shown in FIG. 2, a power supply or source 120 of electrical energy, preferably a source of DC power, which may be switched on to remain constant or may be pulsed, is connected between the cathode assembly 20 and the wall of the chamber 13, which is usually grounded and serves as the system anode. The cathode assembly 20 is insulated from the wall of the chamber 13. The power supply 120 is preferably connected to the cathode assembly 20 through an RF filter 122. A bias power supply or generator 120 is provided and connected to the substrate holder 27 through a matching network 133. The bias power supply 120 applies a bias voltage to a wafer 12 mounted on the holder 27.

Power from the power supply 120 produces a negative potential on the target 10. The negative potential accelerates positive ions from the plasma 23 toward surface 16 of the target 10 which, upon impact, cause electrons to be emitted from surface 16 of the target 10. These electrons become trapped over the surface 16 of the target 10 by the magnetic field generated by the main magnet 30, until, eventually, the electrons strike and thereby ionize atoms of process gas in close proximity to the surface 16 of the target 10, forming a plasma 23 adjacent to the target surface 16. This main plasma 23 becomes a source of positive ions of gas that are accelerated toward and against the negatively charged surface 16, where they eject particles of coating material from the target 10.

The space 28 between the target surface 16 and the substrate support 27 can be considered as formed of two parts. One part is that primarily occupied by the plasma 23, which is shaped to produce a desired erosion pattern on the sputtering surface 16 of the target 10. The second part of the space 28 is a remaining volume 125 that lies between the plasma 23 and the substrate 12 on the support 26. The particles of sputtered material from the target 10 generally originate as electrically neutral particles that propagate by momentum only through the space 28. In a conventional sputtering apparatus, neutral sputtered particles passing through the plasma 23 are not ionized significantly since the plasma 23 occupies a small volume near target surface 16, and at operating pressures of interest, few collisions occur between the neutral sputtered particles and particles of the plasma 23. As such, the neutral sputtered particles exit the plasma 23 mostly neutral and stay neutral until deposited as a thin film on substrate 12.

For depositing a film of target material on the substrate 12 by IPVD, sputtered particles are ionized as they pass through volume 125, so that the particles of sputtered material from the target 10, for example, particles of titanium metal, develop an electrical charge. Once charged, the particles can be electrostatically accelerated or otherwise electrically or magnetically directed into paths that are parallel to the axis of the chamber 13 and perpendicular to the surface of the substrate 12. In-flight ionization of sputtered particles in the space 28 is carried out by inductively coupling RF energy into the volume 125 from an RF coil 130 that surrounds the volume 125 and preferably lies outside of the chamber 13, surrounding the chamber 13. The coil 130 is preferably in the form of a helical coil assembly, though coil configurations other than helical may be used. The coil 130 inductively couples energy into process gas in the volume 125, forming an inductively coupled plasma (ICP) that generally fills the space 125. An RF generator 127, preferably operative in the range of from 0.2 to 60 MHZ, for example of a frequency of 2 MHZ, is connected to the coil 130 through a matching network 133 to provide the energy to the coil 130 to form the plasma in the volume 125.

Sources of processing gas 140, such as argon and nitrogen, are connected to the chamber 13 through a flow control device 141. A high vacuum pump 139 is also connected to the chamber 13 to pump the chamber 13 to a vacuum in the milli Torr or sub-milli Torr range. Pressures in the 5 to 30 milli Torr range, for example of 10 milli Torr, are preferred. The pump 139 maintains the ultra high vacuum with a flow rate of process gas preferably in the range of from about 5 to 100 or 150 standard cubic centimeters per second (sccm).

In the wall of the chamber 13, between the coil 130 and the space 125 there is provided a protective dielectric window 160. The window 160 is formed of a vacuum compatible dielectric material such as quartz or other material that does not impede the magnetic field surrounding the coil from reaching into the volume. The window 160 is mounted to form a vacuum tight seal with the wall of the chamber 13. The window 160 is preferably a single cylindrical piece of electrically insulating and magnetically-transparent material, but it may be formed of joined segments of material arranged to form a generally cylindrical protective structure in the form of electrically insulating windows in an enclosing structure. The coil 130 is preferably wound around the chamber 13 outside of the window 160. Covering the coil 130 on the outside thereof is a conductive metal enclosure 161, which forms a sealed cavity 162, which isolates the coil 130 and also prevents electromagnetic energy from radiating from the coil 130 and from within the chamber 13 to the outside of the chamber 13. The space 162 within the enclosure 161 may be in communication with the outside atmosphere or may be filled with inert gas, at atmospheric or low pressure, provided that formation of a plasma is not supported by the gas in the cavity 162 when the coil 130 is energized.

While the window 160 itself is not electrically conductive, it is susceptible to the accumulation of a coating of conductive material sputtered from the target 10. Electrical conductivity in or on the window 160 supports the induction of azimuthal currents around the chamber 13 which reduce, cancel or otherwise undermine the effectiveness of the RF coupling of energy from the coil 130 to the plasma in the volume 125. Such conductivity of coating on the window 160, particularly in the azimuthal (circumferential) direction, that is, a direction that extends around the chamber 13, produces an inductively coupled short circuit, can negate all or much of the energy inductively coupled into the volume 125.

To prevent such buildup of conductive sputtered material on the window 160, a slit cylindrical shield 170 is provided between the space 28 and the window 160, in close proximity to the inside surface of the window 160. The shield 170 shadows the window 160 from material sputtered from the target 10, and preferably blocks all direct line-of-sight paths between any point on the surface 16 of the target 10 and the window 160. Further according to the preferred embodiment of the present invention, the shield 170 has a longitudinal slit therein that is parallel to the axis of the chamber 13. Shields with a single or plurality of slits fashioned to interrupt eddy currents can also be used. The slit in the shield 170 substantially interrupts circumferential paths in the shield 170 around the chamber 13. This prevents the induction of circumferential or azimuthal currents in the shield 170.

In addition, the shield 170 has an axial extent beyond the axial extent of the coil 130 that reaches substantially the full effective axial extent of the field from the coil 130. The shield 170 is connected through a DC filter 171 to remove plasma induced DC potential from the shield 170. As a result, the electrically conductive shield 170 effectively suppresses electric fields in the RF plasma that are parallel to the axis of the chamber 13, preventing such axial electric fields that would capacitively shield the coil 130 form the volume 125 and thereby undermine the coupling efficiency of energy to the volume 125 from the coil 130. It is preferred that the shield 170 extend axially from behind the plane of the surface 16 of the target 10 to beyond the window 160 and coil 130. With this configuration, the shield 170 more effectively shorts out axial electric fields in the plasma, thereby enhancing the inductive coupling of energy from the coil 130 into the plasma 23.

The preferred embodiment of the invention also produces a high coupling efficiency of energy from the coil 130 into the volume 125 due to a close spacing of the shield 170 from the window 160. This spacing is maintained at a distance that is preferably not more than the mean free path of atoms or molecules in the gas or the minimum diffusion length of the plasma 23 within the chamber 13. This close shield-to-window spacing is in contrast to other proposals which permit formation of plasma adjacent a window or coil protecting non-conductive structure and behind any shield structure that is provided. Such methods have a tendency of reducing the percentage of energy from the coil or other plasma generating electrode into volume through which the sputtered particles pass, thereby reducing the effective plasma and thus the ionization efficiency of the sputtered material. In the apparatus 19, it is contemplated that processing gas pressures in the range of about 5 to 30 milli-Torr will be used for IPVD of titanium. The mean free path of argon gas at such pressures is from 7 mm to 1.0 mm, respectively. As a result, the preferred spacing of the shield 170 from the window 160 is about 1.0 to 10 mm.

On the other hand, the slit in the shield 170 is preferably made greater than approximately 15 mm in width. The width of the slit is sufficiently wide to allow plasma to form in the slit in order to clean sputtered material that might deposit on the edges of the shield 170 adjacent the slit, or on the window 160 as a result of sputtered material that passes through the slit. Such plasma that forms in the slit will extend against the window 160 in the vicinity of the slit and continuously remove, by resputtering the material that deposits on the window 160 at the slit. Other shield configurations are described in U.S. patent application Ser. Nos. 837,551 and 844,757, hereby expressly incorporated by reference herein.

When IPVD of a metal such as titanium from the target 10 onto the substrate 12 is used to achieve directionality of the ionized sputtered particles, an electrical potential gradient may be maintained in the IC-plasma in the space 28 in front of substrate holder 27 by negatively biasing the substrate 12 relative to the plasma with the bias power supply 121, to provide force to accelerate the positively ionized sputtered particles toward and onto the substrate 12 surface. This power supply 121 is preferably an RF generator that operates in the range of from about 0.2 to 80 MHz, for example, at 13.56 MHz. For such a titanium IPVD process, cathode power applied by the power supply 120 to the target 10 is in the range of from 500 to 5000 watts. For a 12 inch diameter target, the power is typically about 1.5 kWatts. The ICP power applied by the generator 127 is preferably in the range of 250 to 5000 watts, typically 2500 watts. The bias of the substrate 12 is preferably in the range of 20 to 100 negative volts, typically −40 volts.

The chamber 13 can be used as an ICP soft etch cleaning module by de-energizing the power supply 120 to the target 10 and, with only argon from the source 140 introduced into the chamber 13, producing an IC-plasma in the space 125 with energy from the RF generator 127 applied to the coil 130. The argon ions produced in the plasma in the space 125 can be accelerated toward the substrate 12 by the bias applied by the bias power supply or generator 127. These ions will strike the surface of the substrate 12 to clean the surface of the substrate 12. Such a process can be used to clean a contact that is in the condition illustrated in FIG. 9 to produce a cleaned contact as illustrated in FIG. 9A.

Figure 9:
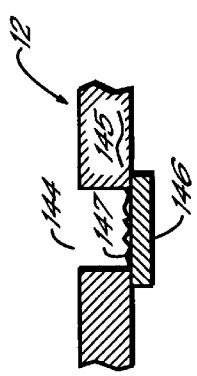
FIG. 9 is a cross-sectional diagram of an electrical contact in a typical condition prior to cleaning.

FIG. 9 is a simplified cross-sectional diagram through a stack on a semiconductor wafer 12 showing a via or hole 144 through an insulating layer 145 thereon exposing a conductor 146 at the bottom of hole 144 which is to form an interconnect with an overlying conductor that is yet to be applied. Following the formation of the hole 144, the wafer 12 would have typically been transferred, either through atmosphere or through a transfer module containing contaminating gases, to a processing apparatus. During the transfer a contaminating layer 147 would have been typically formed, which layer 147 must be removed before an acceptable interconnect with an overlying layer can be applied.

Figure 9A:
FIG. 9A is a diagram, similar to FIG. 9, of the contact following cleaning.
Figure 9B:
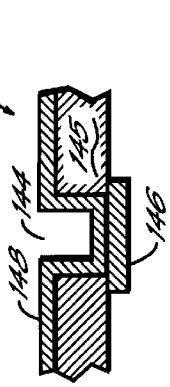
FIG. 9B is a diagram, similar to FIGS. 9, and 9A, of the cleaned electrical contact following coating.

FIG. 9A illustrates the same hole 144 through the insulating layer 145 of the wafer 12 following removal of the contaminating layer 147 during a cleaning process to expose the underlying contact or conductor 146 for interconnection with a conductor of a new stack. FIG. 9B illustrates a cleaned contact 146 at the bottom of the hole 144 through the insulating layer 145 of the wafer 12, following application of a subsequent coating layer 148. This coating layer 148 may be a layer of a metal such as titanium or may be a titanium nitride (TiN) layer, which is commonly applied immediately over a titanium metal layer. Such a coating layer 148 is typically used as a barrier layer prior to the application of a subsequent metal layer such as tungsten in a subsequent process which will serve as a conductor of the upper stack which makes the interconnection with the conductor 146 to form a contact in the hole 144.

In accordance with one preferred embodiment of the invention, the apparatus 19 is operated to perform a plasma precleaning of the wafer 12. The apparatus 19 is operated in a mode similar to that described above for IPVD of the metal, for example of titanium. In such operation, argon gas is maintained in the chamber 13 at approximately 10 milli Torr and ICP power from the generator 127 is increased to 3.5 kWatts, while the substrate bias applied by the generator 127 to the substrate 12 is increased to a negative 50 to 100 volts. A low power of about 500 to 1500 watts is applied by the power supply 120 to the target 10.

Figure 9C:
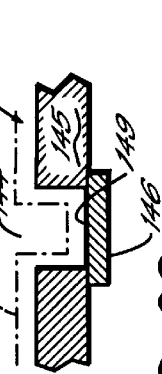
FIG. 9C is a diagram, similar to FIG. 9A, of the contact following cleaning with plasma that includes ions of a metal such as titanium.

As a result of such operation of the apparatus 19, titanium is sputtered from the target 10 and is ionized in the ICP in space 125 along with atoms of the argon gas. The ions of titanium and argon are accelerated onto the substrate 12 by the bias voltage applied to the substrate 12. The heavier titanium ions that are included with the ions that bombard the substrate 12 effectively enhance the cleaning of native oxides and water vapor from the substrate 12 surface and also react with the contaminants to reduce oxides on the surface and to dissolve oxygen into the titanium film. The parameters of target power, ICP power and substrate bias are maintained at a balance such that material is removed from the surface or diluted before the surface becomes covered with titanium, thereby performing a generally etching action. This etching action will be carried out for a time period of approximately 20 seconds. This ionized metal etching action, while cleaning the contact 146, will result in some depositing of metal atoms 149 on the surface of the contact 146, as illustrated in FIG. 9C.

Further in accordance with the preferred embodiment of the invention, when the etching period is completed, the parameters within the apparatus 19 are adjusted more toward the typical parameters used for IPVD of the target material onto the substrate 12. For example, the cathode power is increased to approximately 1.5 kWatts, the substrate bias is reduced to approximately −40 volts and the ICP power is reduced to about 2500 watts. This setting of parameters results in a net deposition of a thin film of titanium on the substrate 12. This deposition is carried out for a period of about 30 seconds, for example. Such a Ti-IPVD clean process can be used to clean a contact 146 that is in the condition illustrated in FIG. 9 to produce a cleaned and Ti-coated contact 146 as illustrated in FIG. 9C, where the underlying conductor 146 is cleaned and has a small initial deposit 149 of titanium on the surface thereof, which is further coated with a thin film 148, which may be of titanium metal, for example, or of titanium metal followed by a layer of TiN.

Further in accordance with the preferred embodiment of the invention, a thin film of titanium nitride (TiN) is then deposited onto the substrate 12 over the film of elemental titanium. This is particularly preferred where the next layer to be formed on the substrate is that of tungsten deposited by chemical vapor deposition (CVD). Such a TiN layer may be formed in the apparatus 19 by introducing nitrogen into the chamber 13. This nitrogen may then be reacted with titanium on the substrate 12 surface according to the known methods of reactive sputter deposition of TiN, such as by thermally energizing the substrate 12 or by biasing the substrate 12 so as to form a plasma such as plasma 23 adjacent the surface of the substrate 12 to stimulate a reaction between the nitrogen in the gas at the substrate 12 surface and titanium impinging onto or deposited on the substrate 12. Alternatively, the TiN film may be deposited onto the substrate 12 following the deposition of the titanium in the apparatus 19 by transferring the wafer 12 from the apparatus 19 to a chamber 13 for TiN deposition by a reactive sputtering or by a CVD process. The resulting interconnect is that illustrated in FIG. 9B.

Further in accordance with the preferred embodiment of the invention, following the titanium cleaning and deposition process, and following a further TiN deposition where present, the wafer 12 is transferred to another tool or through a transfer chamber of the same tool to a processing chamber such as a CVD chamber for further processing, such as for deposition of tungsten or aluminum.

In use, a process gas (not shown), such as argon, is introduced into the gap 28 and the processing chamber 13 is maintained at a vacuum level suitable for sputtering. A high DC or AC voltage is then applied to the cathode assembly 20 and target 10 to cause the formation of a plasma 23 having positively charged argon ions which bombard the sputtering surface 16. This causes target material to be removed from the sputtering surface 16, thus initiating a deposition process wherein some of the target material is deposited onto the substrate 12 to form the film 18. Typically, the deposition process may require between 5 seconds and 5 minutes to complete. In many systems, the substrate 12 is held in a stationary position relative to the sputtering surface 16 during the deposition process. Alternatively, in other systems, the substrate 12 may be slowly scanned in a direction parallel to the sputtering surface 16.

The present invention has been described in relation to a target 10 and substrate 12 arrangement having an arrangement known as a circular rotating magnet cathode. However, it is noted that the present invention may also be utilized in conjunction with rectangular cathodes having moving internal magnets or cathodes having fixed internal magnets. Additionally, it is noted that the present invention may be utilized in conjunction with a cathode that does not include an internal magnet 30. In this embodiment, the magnet device directly influences the plasma charge in a localized area of the target to reduce asymmetry non-uniformity. Further, the present invention may be utilized in other processes which utilize a plasma 23 to remove material from the surface of a substrate 12. This includes a process known as plasma sputter etching, wherein a plasma discharge is used to atomically etch and clean a surface of a substrate. In this process, the magnet device may be used to control the shape and intensity of the plasma discharge to improve uniformity of etching of the substrate.

The present invention provides for the compensation for asymmetric non-uniformities in plasma and physical vapor processing of surfaces in the manufacture of semiconductors so as to enhance the uniformity of plasma processes on the substrates 12. In the embodiments primarily described above, most of the asymmetric non-uniformities of concern are those resulting from stationary components of the processing chamber 13, such as the effects of gas port locations and other elements that alter the distributions of otherwise symmetrical distributions of gas ions or coating material in a way that adversely affects the distribution of the processing effects on the surface of the substrate 12. In sputter coating applications, primary embodiments of the invention have been described which use compensating magnets 54, 76 in combination with sputtering cathode assemblies 20 that have been designed to produce symmetrical erosion patterns that are intended to produce symmetrical distributions of coating material to move from a target 10 and onto a substrate 12. The compensating magnets 54, 76 are designed to alter the originally intended distributions so as to offset and compensate for distortions of the distributions of coating material by components and devices, mostly stationary, in the processing chamber 13. In one preferred primary embodiment, the compensating magnet 100*a* is positioned adjacent or in the general vicinity of the target 10 and in such positions and orientations as to impose a compensating asymmetry on the distribution of material being sputtered from a target 10 in the form of an altered and asymmetrical erosion pattern. The compensating asymmetry is produced in the distribution of ions of process gas of the plasma 23 that bombard the surface of the target 10 to cause the removal of material from the target 10. The compensating magnet 100*a* alters the directions of the positively charged gas ions onto the target surface 16, and may also alter the distribution of the production of gas ions in the plasma 23 by influencing the distribution and paths of electrons in the plasma 23.

In IPVD systems, the invention may be employed to solve the same problems that it solves in more conventional sputter coating systems, using the compensating magnet 100a in the vicinity of the target 10 to make compensating non-symmetrical changes in the target erosion profile. However, in IPVD particularly, the ions of the coating material that are generated may be asymmetrically directed toward the substrate 12 so as to arrive at the surface of the substrate 12 in a symmetrical distribution. This is preferably achieved by providing a compensating magnet 100b adjacent the paths of the ionized material as it moves toward the substrate 12. Where the ionized material is being deposited onto the substrate surface 12, this processing of the surface by the deposition of material may be rendered uniform in a way that compensates to a substantial degree for the asymmetries and asymmetrical effects of elements elsewhere in the chamber 13 or due to other causes. The compensating magnet 100b may be permanent or electromagnetic or positioned behind the target 10, to the side of the processing space 28 or behind the substrate 12 and may take any of various possible orientations as may be required to achieve the desired asymmetry compensating effect. Where the ionized material is being used to etch or otherwise condition the surface of the substrate 12, the invention may be similarly employed to compensate for asymmetries in such processing and to render the processing of the surface of the substrate 12 uniform.

Further, in the processing of a substrate 12 or target surface 16, whether by ions of sputtered or coating material or by ions of gas in the chamber 13, a magnet 100c positioned behind, adjacent or otherwise in the vicinity of the surface 12, 16 being processed can be configured and positioned so as to achieve the desired non-uniformity compensation in the processing of the surface 12, 16 whether by coating, etching, conditioning or whatever other treatment is being carried out by the processing.

It should be understood that the embodiments of the present invention shown and described in the specification are only preferred embodiments of the inventor who is skilled in the art and are not limiting in any way. Therefore, various changes, modifications or alterations to these embodiments may be made or resorted to without departing from the spirit of the invention and the scope of the following claims.

What is claimed is:

1. An apparatus for sputtering material from a source thereof onto a substrate contained in a process chamber that has characteristics which asymmetrically cause a change in the distribution about an axis of the substrate of material moving from a source thereof into an asymmetrically non-uniform distribution onto the substrate, the apparatus comprising:
    a sputtering chamber having a central axis;
    a substrate support centered on the axis in the chamber for supporting a substrate thereon for deposition;
    a target centered on the axis in the chamber providing, when energized, a source of material for processing the substrate;
    a gas in the chamber providing, when energized, a plasma of sputtering gas ions for removing the material from the target;
    a cathode assembly including a main magnet configured to confine a plasma of the sputtering gas adjacent the target in a distribution shaped to produce an erosion of the target by the plasma that is symmetrical about the axis and a connection to an energy source for energizing the target and gas to produce the plasma; and
    a compensating magnet configured and positioned to produce a compensating magnetic field in the plasma effective to change the shape of the distribution of the plasma so as to remove material from the target in a compensated distribution that offsets effects of those characteristics of the chamber to asymmetrically change the distribution about the axis of material onto the substrate so as to compensate for the asymmetrically non-uniform distribution and thereby uniformly treat the substrate with the material.

2. The apparatus of claim 1 wherein:
    the main magnet includes a magnet assembly rotatably mounted on the axis of the chamber to rotate when the gas and target are energized to produce the erosion of the target that is symmetrical about the axis; and
    the compensating magnet includes magnet components fixed relative to the components of the chamber which asymmetrically cause a distribution about the axis of the substrate of material moving from a source thereof in the asymmetrically non-uniform distribution onto the substrate.

3. The apparatus of claim 1 wherein the apparatus is an ionized physical vapor deposition apparatus and further comprises:
    an RF energy source;
    a coil connected to the RF energy source and surrounding the chamber so as to produce a secondary plasma between the target and the substrate support in the chamber when energized with RF energy from the source and to thereby ionize coating material moving from the target onto the substrate on the support; and
    a source of electromagnetic energy coupled to the substrate support so as to at least partially redirect the compensated distribution of material in a direction parallel to the axis and toward the substrate on the support.

4. The apparatus of claim 3 wherein:
    the apparatus includes a control effective to cause the movement of the material from the source thereof onto the substrate at a rate effective to deposit a film of the material on the surface of the substrate.

5. The apparatus of claim 3 wherein:
    the apparatus includes a control effective to cause the movement of the material from the source thereof onto the substrate at a rate effective to etch the surface of the substrate.

6. The apparatus of claim 3 wherein:
    the apparatus includes a control effective to cause the movement of the material from the source thereof onto the substrate at a rate effective to condition the surface of the substrate.

7. An ionized physical vapor deposition apparatus for processing a substrate contained in a process chamber that has characteristics which asymmetrically cause an asymmetrically non-uniform distribution about an axis of the substrate of material from a source thereof onto the substrate, the apparatus comprising:
    a vacuum processing chamber having a central axis;
    a substrate support centered on the axis in the chamber for supporting a substrate thereon for deposition;
    a source of vaporized material, said material moveable in an asymmetrical non-uniform distribution caused by the characteristics onto a substrate on the support;
    a gas in the chamber;
    a radiofrequency (RF) energy source;
    a coil connected to the RF energy source and surrounding the chamber so as to produce a secondary plasma in the gas between the target and the substrate support in the chamber when energized with RF energy from the source and to thereby ionize material moving from the source thereof onto a substrate on the support;

an electromagnetic energy source effective to at least partially redirect the ionized material in a direction parallel to the axis and toward a substrate on the support; and a compensating magnet configured and positioned to produce a compensating magnetic field effective to change the shape of the distribution of ionized material to produce a compensated distribution thereof which offsets effects of those characteristics of the chamber that asymmetrically cause the asymmetrical distribution thereof about the axis of the substrate to thereby compensate for the asymmetrically non-uniform distribution and thereby uniformly treat the substrate with the ionized material.

8. The apparatus of claim 7 wherein the source of vaporized material includes:

a target centered on the axis in the chamber providing, when energized, the source of the coating material;

a gas in the chamber providing, when energized, a main plasma of sputtering gas ions for removing material from the target;

a cathode assembly including a main magnet configured to confine a plasma of the sputtering gas adjacent the target in a distribution shaped to produce an erosion of the target by the plasma that is symmetrical about the axis and a connection to an energy source for energizing the target and gas to produce the main plasma; and the compensating magnet configured and positioned to produce a compensating magnetic field in the main plasma effective to change the shape of the distribution of the main plasma so as to remove material from the target in a compensated distribution that will offset the effects of those characteristics of the chamber to asymmetrically change the distribution about the axis of material being deposited onto the substrate so as to compensate for the asymmetrically non-uniform distribution and thereby uniformly coat the substrate.

9. The apparatus of claim 8 wherein the source of material includes:

the main magnet includes a magnet assembly rotatably mounted on the axis of the chamber to rotate when the gas and target are energized to produce the erosion of the target that is symmetrical about the axis; and the compensating magnet includes magnet components fixed relative to the components of the chamber which asymmetrically cause a distribution about the axis of the substrate of material moving from a source thereof in the asymmetrically non-uniform distribution onto the substrate.

10. The apparatus of claim 7 wherein:

the apparatus includes a control effective to cause the movement of the material from the source thereof onto the substrate at a rate effective to deposit a film of the material on the surface of the substrate.

11. The apparatus of claim 7 wherein:

the apparatus includes a control effective to cause the movement of the material from the source thereof onto the substrate at a rate effective to etch the surface of the substrate.

12. The apparatus of claim 7 wherein:

the apparatus includes a control effective to cause the movement of the material from the source thereof onto the substrate at a rate effective to condition the surface of the substrate.

13. The apparatus of claim 7 wherein:

the compensating magnet is configured and positioned to produce a compensating magnetic field in the path of the material moving onto the substrate effective to change the distribution thereof to a compensated distribution that will offset the effects of those characteristics of the chamber to asymmetrically change the distribution about the axis of material onto the substrate so as to compensate for the asymmetrically non-uniform distribution.

14. The apparatus of claim 13 wherein:

the apparatus includes a control effective to cause the movement of the material from the source thereof onto the substrate at a rate effective to deposit a film of the material on the surface of the substrate.

15. The apparatus of claim 13 wherein:

the apparatus includes a control effective to cause the movement of the material from the source thereof onto the substrate at a rate effective to etch the surface of the substrate.

16. The apparatus of claim 13 wherein:

the apparatus includes a control effective to cause the movement of the material from the source thereof onto the substrate at a rate effective to condition the surface of the substrate.

17. The apparatus of claim 7 wherein the magnet is positioned to the side of a processing space in the chamber.

18. The apparatus of claim 7 wherein the magnet is positioned behind the substrate in the chamber.

19. A plasma processing apparatus for processing a substrate contained in a process chamber that has characteristics which asymmetrically cause an asymmetrically non-uniform distribution about an axis of the substrate of processing ions incident upon the substrate, the apparatus comprising a vacuum processing chamber having a central axis;

a support centered on the axis in the chamber for supporting a surface thereon to be bombarded with ions from a plasma;

a gas in the chamber providing, when energized, a plasma of ions for bombarding the surface on the support;

a structure configured to distribute the plasma in a distribution shaped to produce a distribution of ions that is symmetrical about the axis; and a compensating magnet configured and positioned to produce a compensating magnetic field effective to produce a compensated distribution of ions that will offset the effects of the characteristics of those chamber characteristics that asymmetrically cause the asymmetrical distribution thereof about the axis of the substrate to thereby compensate for the asymmetrically non-uniform distribution and thereby uniformly treat the surface with the processing ions.

20. The apparatus of claim 19 further comprising:

a target having the surface thereon and centered on the axis in the chamber providing, when energized, the source of the coating material;

the gas in the chamber providing, when energized, the plasma;

the structure configured to distribute the plasma includes a cathode assembly including a main magnet to confine the plasma adjacent the target in a distribution shaped to produce removal of material from the surface of the target in a symmetrical distribution about the axis; and the compensating magnet being configured and positioned to produce the compensating magnetic field in the plasma that is effective to change the shape of the distribution of the plasma so as to remove material from the surface of the target in a compensated distribution that will offset the effects of the characteristics of the chamber to asymmetrically change the distribution about the axis of material to compensate for the asymmetrically non-uniform distribution.

21. The apparatus of claim 20 wherein the source of vaporized material includes:

the main magnet includes a magnet assembly rotatably mounted on the axis of the chamber to rotate when the gas and target are energized to produce the erosion of the target that is symmetrical about the axis; and the compensating magnet includes magnet components fixed relative to the components of the chamber which asymmetrically cause a distribution about the axis of the substrate of material moving from a source thereof in the asymmetrically non-uniform distribution onto the substrate.

22. The apparatus of claim 19 wherein:

the surface is the surface of a substrate on the support; and the structure configured to distribute the plasma includes a magnet assembly centered on the axis of the chamber operable to produce the a predetermined distribution of ions on the surface of the substrate; and the compensating magnet includes magnet components fixed relative to the components of the chamber which asymmetrically cause a distribution about the axis of the substrate of ions moving in the asymmetrically non-uniform distribution onto the substrate.

23. A plasma processing apparatus for processing a substrate with a coating material, said substrate contained in a vacuum processing chamber that has characteristics which cause an asymmetrically non-uniform distribution of the coating material about a central axis of the chamber, the apparatus comprising:

a vacuum processing chamber having a central axis;

a substrate support centered on the axis of the chamber for supporting a substrate thereon;

a source of a distribution of coating material in said chamber, said coating material source positioned in the chamber opposite the substrate support;

a gas in the chamber providing, when energized, a plasma between the coating material source and the substrate, said plasma operable to ionize a portion of said coating material; and a compensating magnet positioned on the side of the coating material source adjacent the substrate support and configured to produce an asymmetrical compensating magnetic field effective to produce a compensated distribution of said ionized coating material that will offset the effects of the characteristics of the chamber that cause the asymmetrical distribution thereof about the axis of the chamber to thereby compensate for the asymmetrically non-uniform distribution and thereby uniformly process the surface with said ionized coating material.

24. The apparatus of claim 23, further comprising:

a radiofrequency (RF) energy source; and a coil operably connected to the RF energy source and surrounding the chamber so as to produce the plasma between the coating material source and the substrate support when energized with RF energy from the energy source.

25. The apparatus of claim 23, further comprising a control effective to cause the movement of the ionized coating material from the source thereof onto the substrate at a rate effective to deposit a film of the material on the surface of the substrate.

26. The apparatus of claim 23, further comprising a control effective to cause the movement of the ionized coating material from the source thereof onto the substrate at a rate effective to etch the surface of the substrate.

27. The apparatus of claim 23, further comprising a control effective to cause the movement of the ionized coating material from the source thereof onto the substrate at a rate effective to condition the surface of the substrate.

28. The apparatus of claim 23 wherein said compensating magnet is positioned between the substrate support and the source of coating material.

29. The apparatus of claim 23, wherein said compensating magnet is positioned adjacent the substrate support.

30. A plasma processing apparatus for processing a substrate with ions, said substrate contained in a vacuum processing chamber that has characteristics which asymmetrically cause an asymmetrically non-uniform distribution of the ions about a central axis of the chamber, the apparatus comprising a vacuum processing chamber having a central axis, a first end, and an opposed second end;

a gas in the chamber providing, when energized, a plasma including ions;

a substrate support centered on the axis of the chamber and provided at the first end of the chamber, said substrate support for supporting a substrate thereon to be bombarded with said ions; and a compensating magnet configured and asymmetrically positioned around the central axis to produce an asymmetrical compensating magnetic field effective to produce a compensated distribution of said ions that will offset the effects of the characteristics of the chamber that cause the asymmetrical distribution thereof about the axis of the chamber to thereby compensate for the asymmetrically non-uniform distribution and thereby uniformly treat the surface with said ions.

31. The apparatus of claim 30, further comprising:

a radiofrequency (RF) energy source; and a coil operably connected to the RF energy source and surrounding the chamber so as to produce the plasma when energized with RF energy from the energy source.

32. The apparatus of claim 30, further comprising a control effective to cause the movement of ions from the plasma onto the substrate at a rate effective to etch the surface of the substrate.

33. The apparatus of claim 30, further comprising a control effective to cause the movement of ions from the plasma onto the substrate at a rate effective to condition the surface of the substrate.

34. The apparatus of claim 30, wherein said compensating magnet is positioned between the substrate support and the second end of the chamber.

35. The apparatus of claim 30, wherein said compensating magnet is positioned adjacent the substrate support.

* * * * *